(12) United States Patent
Fautz et al.

(10) Patent No.: US 9,052,373 B2
(45) Date of Patent: Jun. 9, 2015

(54) METHOD AND DEVICE FOR DETERMINING A MAGNETIC RESONANCE SYSTEM ACTIVATION SEQUENCE

(75) Inventors: Hans-Peter Fautz, Forchheim (DE); Rene Gumbrecht, Herzogenaurach (DE)

(73) Assignee: Siemens Aktiengesellschaft, München (DE)

( * ) Notice: Subject to any disclaimer, the term of this patent is extended or adjusted under 35 U.S.C. 154(b) by 580 days.

(21) Appl. No.: 13/429,223

(22) Filed: Mar. 23, 2012

(65) Prior Publication Data

US 2012/0268130 A1    Oct. 25, 2012

(30) Foreign Application Priority Data

Mar. 25, 2011  (DE) .......... 10 2011 006 151

(51) Int. Cl.
| | |
|---|---|
| G01V 3/00 | (2006.01) |
| G01R 33/565 | (2006.01) |
| G01R 33/46 | (2006.01) |
| G01R 33/561 | (2006.01) |

(52) U.S. Cl.
CPC ........ G01R 33/5659 (2013.01); G01R 33/4616 (2013.01); G01R 33/5612 (2013.01)

(58) Field of Classification Search
CPC .................................................. G01R 33/4616
USPC .................................. 324/314, 312, 309, 307
See application file for complete search history.

(56) References Cited

U.S. PATENT DOCUMENTS

| | | | |
|---|---|---|---|
| 7,102,349 B2* | 9/2006 | Hornung ........................ 324/312 |
| 7,336,145 B1* | 2/2008 | Zelinski et al. ................ 324/309 |
| 8,169,219 B2* | 5/2012 | Morrell ......................... 324/314 |
| 8,542,013 B2* | 9/2013 | Mößnang et al. .............. 324/309 |
| 2009/0322329 A1 | 12/2009 | Diehl et al. | |
| 2010/0141252 A1 | 6/2010 | Fautz et al. | |
| 2011/0254546 A1 | 10/2011 | Ritter | |
| 2012/0194185 A1 | 8/2012 | Ritter | |

FOREIGN PATENT DOCUMENTS

| | | |
|---|---|---|
| DE | 10 2008 061 455 A1 | 6/2010 |
| DE | 10 2008 029 175 B4 | 9/2010 |
| DE | 10 2010 015 066 A1 | 10/2011 |
| DE | 10 2010 033 329 A1 | 2/2012 |

OTHER PUBLICATIONS

German Office Action dated Mar. 14, 2012 for corresponding German Patent Application No. DE 10 2011 006 151.7 with English translation.
W. Grissom et al., "Spatial Domain Method for the Design of RF Pulses in Multicoil Parallel Excitation," Magnetic Resonance in Medicine 56, pp. 620-629, 2006.
R. Gumbrecht et al., "Fast high-flip pTx pulse design to mitigate B1+ inhomogeneity using composite pulses at 7T," Proc. ISMRM, 2010.

* cited by examiner

*Primary Examiner* — Louis Arana
(74) *Attorney, Agent, or Firm* — Lempia Summerfield Katz LLC

(57) ABSTRACT

A method and control a sequence determination device for determining a magnetic resonance system-activation sequence are provided. The magnetic resonance system-activation sequence includes a multichannel pulse having a plurality of individual HF pulses to be emitted in a parallel manner by the magnetic resonance system by way of different independent high-frequency transmit channels. A multichannel pulse is calculated based on a predefined MR excitation quality using an HF pulse optimization method, and an HF pulse length is optimized with respect to an HF energy parameter.

17 Claims, 4 Drawing Sheets

METHOD AND DEVICE FOR DETERMINING A MAGNETIC RESONANCE SYSTEM ACTIVATION SEQUENCE

This application claims the benefit of DE 10 2011 006 151.7, filed on Mar. 25, 2011.

BACKGROUND

The present embodiments relate to a method and a control sequence determination facility for determining a magnetic resonance system activation sequence.

In a magnetic resonance system, the body to be examined may be exposed to a relatively high basic magnetic field known as the $B_0$ field of 3 or 7 Tesla, for example, with the aid of a basic field magnet system. A gradient system is also used to apply a magnetic field gradient. High-frequency excitation signals (HF signals) are then emitted by way of a high-frequency transmit system using suitable antenna facilities. The aim is to tip the nuclear spin of certain atoms that have been excited in a resonant manner by the high-frequency field with spatial resolution through a defined flip angle in relation to the magnetic field lines of the basic magnetic field. The high-frequency magnetic field emitted in the form of individual pulses or pulse trains is also referred to as the $B_1$ field. This magnetic resonance excitation (MR excitation) by magnetic high-frequency pulses and the resulting flip angle distribution are also referred to below as nuclear magnetization or "magnetization". During relaxation of the nuclear spin, high-frequency signals (e.g., magnetic resonance signals) are emitted. The magnetic resonance signals are received using suitable receive antennas and are further processed. Raw data acquired in this manner may be used to reconstruct the desired image data. Emission of the high-frequency signals for nuclear spin magnetization may take place using a whole body coil or body coil. A typical structure of a whole body coil is a birdcage antenna consisting of a number of transmit rods disposed around a patient chamber of the tomography system, in which a patient is present during the examination. The transmit rods may run parallel to the longitudinal axis. End faces of the antenna rods are connected, respectively, in a capacitive manner in a ring. Local coils, however, may be used in proximity to the body to emit MR excitation signals. The magnetic resonance signals may be received using the local coils. Alternatively or additionally, the magnetic resonance signals may be received using the body coil.

Whole body antennas may be operated in a "homogeneous mode" (e.g., a "CP mode"). A single temporal HF signal with a defined fixed phase and amplitude ratio is emitted to all the components of the transmit antenna (e.g., all the transmit rods of a birdcage antenna). Individual HF signals may be assigned to the individual transmit channels (e.g., the individual rods of a birdcage antenna). A multichannel pulse that includes a number of individual high-frequency pulses is emitted in a parallel manner by way of the different independent high-frequency transmit channels. Such a multichannel pulse (e.g., a "pTX-pulse" due to the parallel emission of the individual pulses) may be used, for example, as an excitation, refocusing and/or inversion pulse. An antenna system having a number of independently activatable antenna components or transmit channels may also be referred to as a "transmit array," regardless of whether the antenna system is a whole body antenna or an antenna arrangement disposed in proximity to the body.

Such pTX pulses or pulse trains made up of such may be determined beforehand for a certain planned measurement. To plan the HF pulse sequence, the user predefines an MR excitation quality (e.g., in the form of a target magnetization). The user may, for example, predefine a desired flip angle distribution with spatial resolution. The predefined desired flip angle distribution is used within a target function as a setpoint value. The appropriate HF pulse sequence for the individual channels is then calculated in an optimization program (e.g., a "target function optimizer"), so that predefined MR excitation quality is achieved. A method for designing such multichannel pulses in parallel excitation methods is described, for example, in W. Grishom et al.: "Spatial Domain Method for the Design of RF Pulses in Multicoil Parallel Excitation", Mag. Res. Med. 56, 620-629, 2006.

For a certain measurement, the different multichannel pulses, the gradient pulses associated with the respective activation sequence and further control defaults are defined in a measurement protocol. The measurement protocol is produced beforehand and may be called up for a certain measurement from a memory, for example, and optionally changed by the operator in situ. During the measurement, the magnetic resonance system is controlled fully automatically on the basis of this measurement protocol, with the control facility of the magnetic resonance system reading the commands out of the measurement protocol and processing the commands.

Every MR excitation results in high-frequency exposure of the patient, which must be limited according to certain rules. Too great a high-frequency exposure may harm the patient. HF exposure refers not only to the HF energy input but also to physiological exposure induced by the HF irradiation. A typical measure of high-frequency exposure is the specific absorption rate (SAR) value that indicates in watts/kg the biological exposure acting on the patient due to a certain high-frequency pulse output. Another measure of high-frequency exposure if the specific energy dose (SED) value. The two values are readily converted to one another.

For the emission of homogeneous fields, a global high-frequency exposure may be monitored. For example a standardized limit of 4 watts/kg at the "first level," according to the IEC standard, applies for the global SAR exposure of a patient. Since during the emission of pTX pulses in the patient the previously homogeneous excitation may be replaced by any form of excitation, "hotspots," where the high-frequency exposure may be many times the values known previously from homogeneous excitation, may form. With pTX transmit methods, both global and local high-frequency exposure is to be taken into account.

The high-frequency exposure of the patient is monitored continuously on the magnetic resonance system during the examination using suitable safety devices, and a measurement is changed or terminated if the monitored HF exposure value is above the specified standards. The expected HF exposure is to be estimated as accurately as possible during prior planning, and to be taken into account when determining the magnetic resonance system activation sequence to avoid exceeding the limit values during measurement. The interruption of measurement necessitates a new measurement.

The maximum permitted high-frequency exposure is a significantly limiting factor in MR imaging (e.g., at higher field strengths). For example, the pulse energy and therefore also the high-frequency exposure caused by an HF pulse may be reduced by lengthening the relevant high-frequency pulse. However, lengthening an HF pulse narrows the band of its frequency spectrum. The option of shortening the pulses is therefore limited by the spatial inhomogeneity of the $B_0$ field, since the MR excitation frequency is a function of the $B_0$ field strength. Conventionally, therefore, within the scope of possible output limitations, the HF pulses are as a maximum, made so short that the $B_0$ field inhomogeneities may be ignored. There has been no provision to date for pulse shortening beyond this to reduce the high-frequency exposure.

SUMMARY AND DESCRIPTION

The present embodiments may obviate one or more of the drawbacks or limitations in the related art. For example, a method and corresponding control sequence determination facility for determining magnetic resonance system activation sequences that allow further reduction of the local high-frequency exposure of the patient while optimally complying with a predefined MR excitation quality is provided.

In one embodiment, a multichannel pulse is calculated based on a predefined MR excitation quality using an HF pulse optimization method. In the HF pulse optimization method, an HF pulse length (e.g., the temporal duration of a pulse) is optimized with respect to an HF energy parameter. The HF energy parameter may be, for example, a parameter that represents a local and/or global energy input into the examination object or a local/global HF exposure value (e.g., a SAR or SED value) of an examination object. This is based on the fact that in a pTX transmit method, the use of dynamic pulses (e.g., the variation of the amplitude and phase response) provides that the MR excitation may also be controlled spatially and tailored to the local $B_0$ field strength. Taking into account the HF energy-parameter provides that the equalization of the spatial $B_0$ variation in the MR excitation may also result in an HF energy reduction compared with conventional pulse calculation methods. This optimization may take place for all pulses of a multichannel pulse train.

One embodiment of a control sequence determination facility includes an input interface for detecting a predefined MR excitation quality. The control sequence determination facility also includes an HF pulse optimization unit to calculate a multichannel pulse based on a predefined MR excitation quality using an HF pulse optimization method, and a control sequence output interface to transfer the control sequence for activating the magnetic resonance system for data acquisition to a control facility or to store the control sequence in a memory for this purpose. The control sequence determination facility is configured so that the control sequence determination facility optimizes an HF pulse length with respect to an HF energy parameter using the HF pulse optimization method.

In one embodiment of a method for operating a magnetic resonance system, an activation sequence is determined, as described above, and the magnetic resonance system is operated using this activation sequence. One embodiment of a magnetic resonance system has a control sequence determination facility, as described above.

Parts of the control sequence determination facility may be configured as software components. This applies, for example, to the HF pulse optimization unit. The input interface may, for example, be a user interface for the manual inputting of a predefined MR excitation quality (e.g., even a graphical user interface). The input interface may also be an interface for selecting and transferring data (e.g., also a target magnetization) from a data memory disposed within the control sequence determination facility or connected thereto by way of a network (optionally, also using the user interface). The control sequence output interface may be, for example, an interface that transfers the control sequence to a magnetic resonance controller in order to control the measurement directly. The control sequence output interface may also be an interface that sends the data by way of a network and/or stores the data in a memory for later use. These interfaces may be at least partially configured as software and may access hardware interfaces of an existing computer.

The present embodiments therefore also include a computer program that may be loaded directly into a memory (e.g., a non-transitory computer readable medium) of a control sequence determination facility, having program code segments in order to execute all the acts of a method of the present embodiments when the program is executed in the control sequence determination facility by a processor. Such a software-based implementation has the advantage that former facilities used to determine control sequences (e.g., suitable computers in computer centers of the magnetic resonance system manufacturer) may also be modified by implementing the program in an appropriate manner to determine control sequences that are associated with a lower level of and/or more reliably, controllable high-frequency exposure.

The claims of one category may be developed in the same way as the dependent claims of a different claim category.

With the method of the present embodiments, almost the same defaults may be set for calculating the magnetic resonance system activation sequence as with previous methods. In other words, the predefined MR excitation quality may be predefined in the same manner as before. Similarly, an operator may also predefine a transmit k space gradient trajectory in the usual manner to generate a multichannel pulse or pulse train. The "transmit k space gradient trajectory" (abbreviated in the following to "gradient trajectory") refers to the places in the k space that may be started up by setting the individual gradients at certain times (e.g., by gradient pulse trains (with appropriate x, y and z gradient pulses) to be emitted in a coordinated manner as appropriate for the IV pulse trains). The k space is the spatial frequency space, and the gradient trajectory in the k space describes the path in the k space traveled in time during emission of an HF pulse or the parallel pulses by corresponding switching of the gradient pulses. By setting the gradient trajectory in the k space, the spatial frequencies, at which certain HF energies are deposited, may be determined.

For optimization purposes, a $B_0$ map (e.g., a map that represents the homogeneity of the $B_0$ field, as determined in a test measurement in a certain region), in which excitation is to take place, and corresponding $B_1$ maps that represent the $B_1$ field strength in the region of interest for the individual transmit channels may be used as input data for the optimization method.

With the method of the present embodiments, a fixed pulse length is not determined, but a start HF pulse length or candidate HF pulse length may be predefined instead. The start HF pulse length or the candidate HF pulse length may be a possible starting point in the optimization method in order to determine an optimum HF pulse length with respect to the predefined HF energy parameter, taking into account the predefined MR excitation quality.

There are various possibilities for the precise procedure within the HF pulse optimization method. An HF pulse optimization method, like almost every optimization method, may operate with a predefined target function. Until now, a target function in the manner of $$\min_{RF}(m_{des} - m(RF))^2 \qquad (1)$$

has been used for this purpose. RF represents the high-frequency pulse form for all transmit channels, m(RF) is the magnetization pattern that would be achieved by a given high-frequency pulse with this pulse form RF, and $m_{des}$ is the actually desired target magnetization pattern. The pulse length L is included as a fixed predefined variable in the pulse form RF and is therefore not indicated specifically in equation (1).

A target function optimizer may therefore also be used in the method of the present embodiments. The target function optimizer may be a conventional target function optimizer that operates in the usual manner with a known optimization algorithm (e.g., a fast, non-linear optimizer that resolves the Bloch equations). Various optimizers in the form of software components are known to the person skilled in the art. What matters, however, is which target functions are predefined for resolution for the optimizer.

In one embodiment, a target function optimizer is used within the context of the HF pulse optimization, with the target function being based both on the predefined MR excitation quality and on the HF energy parameter and an HF pulse length parameter being used as an additional variable (e.g., as a variable parameter) at the same time in the target function optimizer. Such a target function may appear, for example, as follows:

$$\min_{RF,L}((m_{des} - m(RF, L))^2 + \lambda E(RF, L)) \qquad (2)$$

This target function is therefore extended compared with equation (1) so far as the magnetization pattern m(RF,L) that may be achieved with the HF pulse is additionally a function of a variable L (e.g., the total pulse length) that is no longer defined as a constant of the pulse form RF. An equalization term $\lambda E(RF,L)$ is added, where E(RF,L) is a high-frequency energy term that is a function of the high-frequency pulse form RF and the total pulse length L in the target volume (e.g., the HF energy parameter). As described above, this may be, for example, the energy input in the target volume or another exposure value in the examination object (e.g., a global or local SAR or SED value or a combination of local and global values). The scalar factor $\lambda$ is a weighting factor in order to be able to decide between the HF energy parameter that is to be additionally optimized, and the predefined MR excitation quality that is to be optimized as before. The factor $\lambda$ is a function of a plurality of different factors such as the number of transmit channels, the number of time steps, and the structure of the $B_0$ maps and $B_1$ maps, to name but a few. The factor $\lambda$ may also be defined beforehand, for example, in test optimization runs, independently of the specific measurement, and independently of the examination object (e.g., specifically for the device or type of device). The factor $\lambda$ may be stored for further specific measurements. Alternatively, The factor $\lambda$ may also be determined as a free variable in the optimization method.

Such a target function according to equation (2) is similar to a vector target function, in which two subfunctions are optimized.

One embodiment of a control sequence determination facility is to be configured so that in the HF pulse optimization method, the control sequence determination facility uses a target function that is based on a predefined MR excitation quality and the HF energy parameter (e.g., the target function predefined according to equation (2)).

In another embodiment, also within the context of the HF pulse optimization method, a target function optimizer may be run through iteratively a number of times, with a current HF pulse length being predefined as a constant for the target function optimizer in each iteration step. In each step, a current multichannel pulse is determined for the current HF pulse length value, and a current HF energy parameter value is determined for the current multichannel pulse. Depending on the current HF energy parameter, whether a new iteration step is performed or whether the iteration method is terminated, is determined.

To determine whether or not a new iteration step is performed, the current HF energy parameter value, for example, may be compared with the HF energy parameter value in the last iteration step. If the HF energy parameter value is lower, an attempt may be made to reach an even lower value in the next iteration step. If the HF energy parameter value is higher, however, the method may be terminated, and it is determined, for example, that the penultimate calculated multichannel pulse before termination of the iteration that resulted in the lowest HF energy parameter value, is used as the optimization result.

With this method, the same target function optimizer as in the first method may, for example, be used, but a traditional, simple target function (e.g., the target function according to equation (1)) that is based on a fixed HF pulse length within the target function optimization algorithm may again be used. Instead, optimization of the HF pulse length takes place with respect to the HF energy parameter value within the context of the iterative loop, which is of a higher order than the target function optimizer.

This embodiment is relatively fast and therefore simple to apply. Often, very many variables are to be taken into account with the traditional target function, and with every additional variable, disproportionately more computation time is used to determine the optimum multichannel pulse. Therefore, in many instances, the use of a target function optimizer with a traditional target function, as used to date, is faster despite the multiple iterative run through than including the HF pulse length as an additional variable and additional optimization to the HF energy parameter value within the target function itself.

To accelerate the method even more, a certain number of candidate HF pulse lengths may also be predefined. Within the context of the HF pulse optimization method, a target function optimizer that is run through a number of times may be used (e.g., with a current HF pulse length being selected in each instance in each step or run through from the number of predefined candidate HF pulse lengths as the fixed HF pulse length for this run through).

It is possible, for example, for the same target function optimizer (e.g., also the same target function as in the iterative method) to be used. In contrast to the iterative method, however, the number of steps is precisely set, since a target function is simply optimized once for all the candidate HF pulse lengths. The candidate HF pulse length, for which the calculated HF energy parameter value is lowest, is selected as the optimum HF pulse length. For this method, one embodiment of a control sequence determination facility includes a memory or access to a memory, in which the candidate HF pulse lengths are stored.

The HF pulse optimization method may also use further input data to achieve an optimum result. In one embodiment, a current $B_0$ map may be predefined as input data for the HF pulse optimization method, and a current $B_1$ map may be predefined as input data for each transmit channel. These are maps that were recorded beforehand as test measurements with the current examination object or patient in the current device. One embodiment of a control sequence determination facility has a corresponding input interface to transfer the $B_0$ map or $B_1$ maps. The use of this additional input data may take place with any of the target function optimizers described above and independently of the target function.

In one embodiment, the multichannel pulses may be calculated first within the context of the HF pulse optimization method of the present embodiments for a lower target magnetization. The multichannel pulse calculated in this process is scaled up to a final target magnetization and optionally corrected once again. This procedure utilizes the fact that for small magnetizations (e.g., for small flip angles in what is called the "low flip range") between 0 and 5°), the magnetization response is still linear. Therefore, a calculation using an optimization method is much simpler and more stable in this range. When the optimum multichannel pulse has been found for this range, it is possible to scale up in a subsequent step. If, for example, the calculation takes place in the low flip range for a flip angle of maximum $\alpha=5°$, and the actual magnetization is to take place at a flip angle $\alpha$ of maximum 90°, the amplitude values of the HF pulses may be multiplied by a factor 18 according to the flip angle ratio. The resulting errors may then be determined and corrected within the context of a (Bloch) simulation.

DETAILED DESCRIPTION OF THE DRAWINGS

Figure 1:
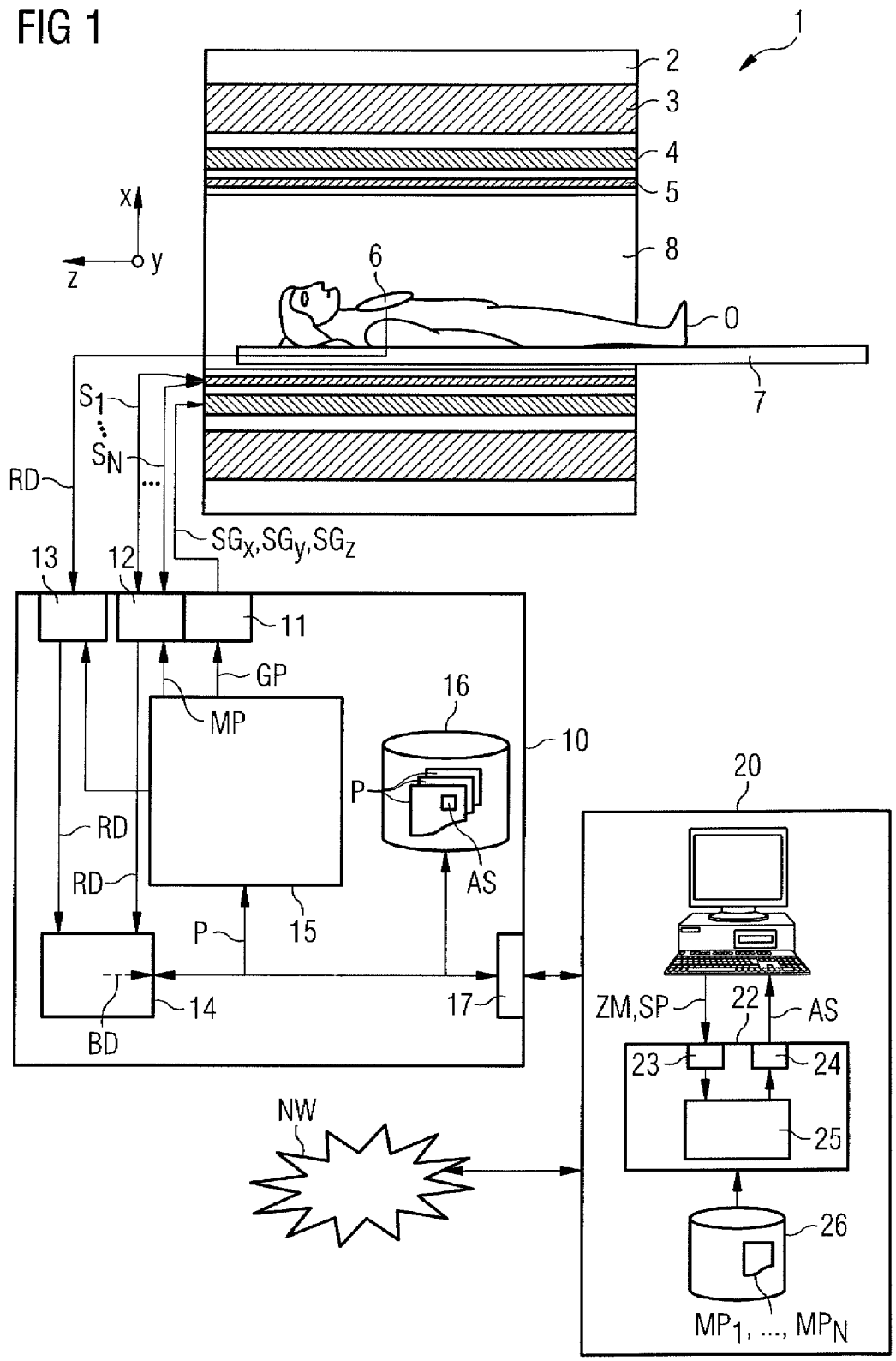
FIG. 1 shows a schematic diagram of one embodiment of a magnetic resonance unit.

FIG. 1 shows a schematic diagram of one embodiment of a magnetic resonance unit 1. The magnetic resonance unit 1 includes an actual magnetic resonance scanner 2, with an examination chamber 8 or patient tunnel 8 located therein. A couch 7 (e.g., a table or a bed) may be moved into the patient tunnel 8, so that a patient O or subject lying thereon may be supported in a certain position within the magnetic resonance scanner 2 relative to a magnet system and a high-frequency system disposed therein during an examination, or may be moved between different positions during a measurement.

Components of the magnetic resonance scanner 2 include a basic field magnet 3, a gradient system 4 having magnetic field gradient coils to apply any magnetic field gradients in the x, y and z directions, and a whole body high-frequency coil 5. Magnetic resonance signals induced in the examination object O may be received by way of a whole body coil 5 that may also be used to emit the high-frequency signals to induce the magnetic resonance signals. These signals may be received using local coils 6 positioned, for example, on or below the examination object O. All these components are known in principle to the person skilled in the art and are therefore only shown in a roughly schematic manner in FIG. 1.

The whole body high-frequency coil 5 is structured, for example, as a birdcage antenna and has a number N of individual antenna rods. The individual antenna rods run parallel to the patient tunnel 8 and are evenly distributed over the periphery of the patient tunnel 8. Ends of the individual antenna rods are connected respectively in a capacitive manner in a ring.

The individual antenna rods may be activated separately as individual transmit channels $S_1, \ldots, S_N$ by a control facility 10 (e.g., a control device). This may be a control computer that includes a plurality of individual computers. The plurality of individual computers may optionally also be spatially separated and connected together by way of suitable cables or the like. A terminal interface 17 connects this the facility 10 to a terminal 20, by way of which an operator may activate the unit 1 as a whole. In one embodiment, the terminal 20 is configured as a computer with a keyboard, one or more screens and further input devices (e.g., a mouse or the like), so that a graphical user interface is available to the operator.

The control facility 10 includes, for example, a gradient control unit 11 that may include a number of subcomponents. The gradient control unit 11 is used to connect the individual gradient coils to gradient control signals $SG_x, SG_y, SG_z$. The gradient control signals $SG_x, SG_y, SG_z$ are gradient pulses that are applied during a measurement at precisely specified temporal positions and with a precisely predefined temporal profile.

The control facility 10 also includes a high-frequency (HF) transmit/receive unit 12. The HF-transmit/receive unit 12 includes a number of subcomponents in order to be able to transmit high-frequency pulses in a separate and parallel manner to each of the individual transmit channels $S_1, \ldots S_N$ (e.g., to the individually activatable antenna rods of the body coil). Magnetic resonance signals may also be received by way of the transmit/receive unit 12. This may be done with the aid of the local coils 6. The raw data RD received using the local coils 6 is read out from an HF receive unit 13 and processed. The magnetic resonance signals received from the local coils 6 or from the whole body coil using the HF transmit/receive unit 12 are transferred as raw data RD to a reconstruction unit 14. The reconstruction unit 14 reconstructs the image data BD therefrom and stores the image data BD in a memory 16 and/or transfers the image data BD by way of the interface 17 to the terminal 20, so that the operator may view the image data BD. The image data BD may also be stored and/or displayed and evaluated in other places by way of a network NW.

The gradient control unit 11, the HF transmit/receive unit 12 and the receive unit 13 for the local coils 6 are activated in a respectively coordinated manner by a measurement control unit 15. This provides, using corresponding commands, that a desired gradient pulse GP is emitted by suitable gradient control signals $SG_x, SG_y, SG_z$ and activates the HF transmit/receive unit 12 in a parallel manner so that one or more multichannel pulses MP (e.g., a multichannel pulse train including a number of multichannel pulses MP) is/are emitted. In other words, the appropriate high-frequency pulses are passed to the individual transmit rods of the whole body coil 5 in a parallel manner on the individual transmit channels $S_1, \ldots S_N$. At the appropriate time point, the magnetic resonance signals at the local coils 6 are read out by the HF receive unit 13, or any signals at the whole body coil 5 are read out by the HF transmit/receive unit 12 and further processed. The measurement control unit 15 predefines the corresponding signals (e.g., the multichannel pulses MP to the high-frequency transmit/receive unit 12 and the gradient pulses GP to the gradient control unit 11) according to a predefined control protocol P. All the control data that is to be set during a measurement is stored in the control protocol P.

In one embodiment, a plurality of control protocols P for different measurements is stored in a memory 16. The plurality of control protocols P are selected by the operator by way of the terminal 20 and may be varied in order to have an appropriate control protocol P for the currently desired measurement, with which the measurement control unit 15 may operate. The operator may also call up control protocols P by way of a network NW (e.g., from a manufacturer of the magnetic resonance system 1) and modify and use the control protocols P, as required.

The basic sequence of such a magnetic resonance measurement and the abovementioned components for activation are, however, known to the person skilled in the art, so they will not be discussed in further detail here. Such a magnetic resonance scanner 2 and the associated control facility 10 may also include a plurality of further components that are likewise not examined in detail here.

The magnetic resonance scanner 2 may also have a different structure (e.g., with a patient chamber open at the side). The high-frequency whole body coil does not have to be in the form of a birdcage antenna. The magnetic resonance scanner 2 has a number of separately activatable transmit channels $S_1, \ldots, S_N$, and a corresponding number of channel controllers is accordingly available in the control facility 10 by way of the high-frequency-transmit/receive facility in order to be able to activate the individual transmit channels $S_1, \ldots, S_N$ separately.

FIG. 1 also shows a schematic diagram of one embodiment of a control sequence determination facility 22 (e.g., a control sequence determination device) that is used to determine a magnetic resonance system activation sequence AS. The magnetic resonance system activation sequence AS contains, among other things, one or more predefined multichannel pulses MP for activating the individual transmit channels $S_1, \ldots, S_N$ g for a certain measurement. The magnetic resonance system activation sequence AS is created as part of the measurement protocol P, for example.

The control sequence determination facility 22 is shown in FIG. 1 as part of the terminal 20 and may be implemented as software components on the computer of said terminal 21. The control sequence determination facility 22 may, however, also be part of the control facility 10 or may be implemented on a separate computation system. The finished activation sequences AS are transferred, optionally within the context of a complete control protocol P, by way of a network NW to the magnetic resonance system 1.

The control sequence determination facility 22 includes an input interface 23. By way of the input interface 23, the control sequence determination facility 22 obtains a predefined MR excitation quality (e.g., a target magnetization ZM) that predefines the intended nature of the flip angle distribution during the desired measurement. Other input values (e.g., a gradient trajectory, a start HF pulse length, a $B_0$ map, and/or the $B_1$ maps) may also be predefined by way of this interface 23. The gradient trajectory, for example, or the start HF pulse length may be predefined, for example, by an expert trained to design control protocols for certain measurements. The gradient trajectory or the start HF pulse length may also be already predefined in a control protocol, from which the corresponding data is taken to determine the activation sequence in order to generate the multichannel pulse therefrom and use the activation sequence for the subsequent measurement on the current patient at the current device. The $B_0$ map and the $B_1$ map are measured for the current patient O in each instance during the previous adjustment and test measurements.

The data thus obtained is transferred to an HF pulse optimization unit 25 that automatically creates a certain activation sequence AS with the optimum multichannel pulse MP to achieve the desired target magnetization ZM (or a complete multichannel pulse train having a number of multichannel pulses).

This data may be output by way of a control sequence output interface 24 and transferred, for example, within the context of a control protocol P, in which further defaults for activating the magnetic resonance system 1 are indicated (e.g., parameters for reconstructing images from the raw data), to the control facility 10.

The sequence of a method for determining a magnetic resonance system activation sequence AS is described below for different exemplary embodiments based on the flow diagrams according to FIGS. 2 to 4.

Figure 2:
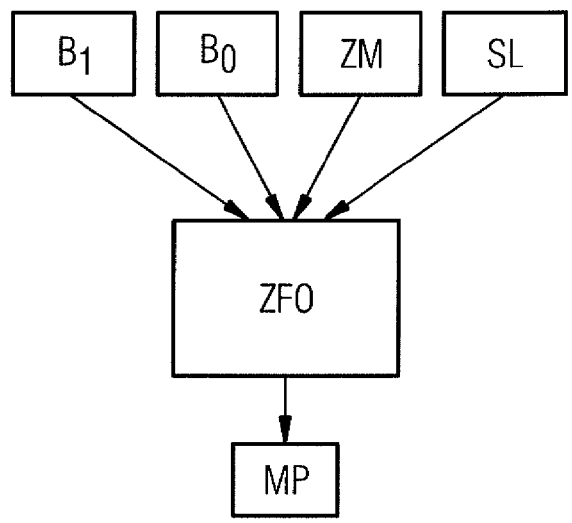
FIG. 2 shows a flow diagram of one embodiment of a method for determining a magnetic resonance system activation sequence.
Figure 5:
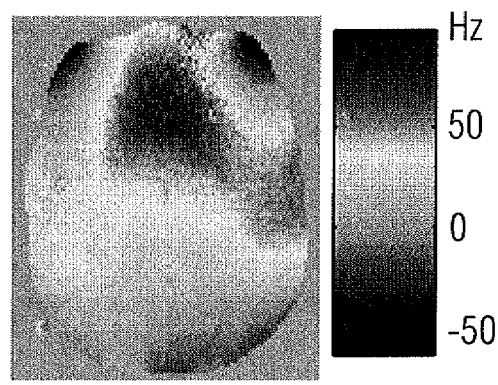
FIG. 5 shows a diagram of an exemplary $B_0$ map.

FIG. 2 shows one embodiment of a method for determining a magnetic resonance system activation sequence. The $B_1$ maps $B_1$, the $B_0$ maps $B_0$, the target magnetization ZM, and a start HF pulse length SL are predefined as input data for a target function optimizer ZFO. FIG. 5 shows an example of a $B_0$ map through the head of a patient. Such a map may be color scaled (e.g., gray scaled) in Hz for display purposes, with the parameter scale shown in the form of a color scale (e.g., a gray scale) immediately adjacent to the $B_0$ map. FIG. 2 shows the deviations upwards and downwards, respectively, from the desired Lamor frequency; in other words, the value 0 Hz corresponds to the MR resonance frequency (e.g., Lamor frequency) of 298.06 MHz for a magnetic field of 7 Tesla. The $B_0$ field has significant inhomogeneities that are to be compensated for by the spatial variation of the pTX pulse.

The target function optimizer ZFO may be a standard optimizer, as is already available as a software module on many devices. This target function optimizer is equipped with a target function that is not only based on the predefined MR excitation quality (e.g., the target magnetization ZM) and optimizes the predefined MR excitation quality, but also optimizes an HF energy parameter EP (e.g., with respect to a minimum SAR exposure) and thereby utilizes the HF pulse length of all possible HF pulses as further variable parameters. For example, the target function optimizer may utilize the target function according to equation (2) for this purpose.

As a result, a multichannel pulse MP (or depending on the setting of the target function optimizer optionally a complete multichannel pulse train) that is not only optimized with respect to target magnetization but also with respect to the length of the individual pulses is output. The length is optimized such that where possible, there is a low energy input in the patient (e.g., a low SAR exposure).

As described above, such an optimization takes longer, the more degrees of freedom there are available in the target function. FIG. 3 therefore shows, by way of an alternative, a faster method, in which the target function ZFO is ultimately replaced by a somewhat simpler target function ZFO' that has the same structure as the conventional target functions (e.g., a simple target function, as in equation (1)). The $B_1^+$ maps, the $B_0$ map, the target magnetization ZM, and a pulse length start value $PL_1$ are also predefined first for this target function optimizer ZFO', as in the exemplary embodiment according to FIG. 2.

Before the start of the iteration, the running variable i is set to the value 1. A first run through takes place within the target function optimizer ZFO'. The result is a multichannel pulse $MP_i$ or a complete multichannel pulse train (e.g., in the first run through the first multichannel pulse $MP_1$). In a further act, the HF energy parameter $EP_i$ (e.g., a SAR value), which may be taken into account and minimized within the context of the method, is calculated for the current multichannel pulse train $MP_i$.

In a further act, whether the energy parameter value $EP_i$ is smaller than the energy parameter value of the preceding step $EP_{i-1}$ is checked. This act may be dispensed with in the first run through of the loop, or a corresponding very high value $EP_0$ is predefined as the first value so that the loop leads to a further iteration step at this time point. If it is ascertained that the current HF energy parameter value $EP_i$ is smaller than the preceding HF energy parameter value $EP_{i-1}$ (branch y), the current HF pulse length $PL_i$ is replaced by a new HF pulse length $PL_{i+1}$ for the next iteration step. The new HF pulse length $PL_{i+1}$ is greater than the preceding pulse length $PL_i$. The target function optimizer ZFO' is run through again with the new pulse length $PL_{i+1}$, in order thus to obtain a new multichannel pulse $MP_{i+1}$, for which the new HF energy parameter value $EP_{i+1}$, is then calculated again.

This method is continued until it is ascertained that the new HF energy parameter value EP, is no longer smaller than the preceding HF energy parameter value (branch n). The preceding multichannel pulse $MP_{i-1}$ may then be selected as the optimum multichannel pulse (or complete multichannel pulse), since the preceding multichannel pulse resulted in the smallest HF energy parameter value $EP_{i-1}$.

Since such an iterative method still uses a relatively large amount of computation time, at least if a plurality of iteration steps is used, a further simplified method is described below with reference to FIG. 4. The same target function optimizer ZFO' is used with the same target function as in the method according to FIG. 3. However, instead of only one start HF pulse length $PL_1$ being predefined, as in FIG. 3, a fixed number N of candidate HF pulse lengths $PL_1, \ldots PL_N$ is predefined (e.g., the values 4, 6, 8, 10, 12, 14, 16, 18 ms). These candidate HF pulse lengths $PL_1, \ldots PL_N$ may be stored, for example, in a memory 26, to which the HF pulse optimization unit 25 has access (see FIG. 1).

The loop is run through for all the candidate HF pulse lengths $PL_1, \ldots PL_N$, and an HF energy parameter value $EP_1, \ldots EP_N$ is determined using the target function optimizer ZFO' for each of the candidate HF pulse lengths $PL_1, \ldots PL_N$.

The illustrated loop is run through, and the HF energy parameter value $EP_i$ is determined first each time. Whether the running variable i is below the number N of candidate HF pulse lengths $PL_1, \ldots PL_N$ is determined. If so (branch y), a further multichannel pulse $MP_{i+1}$ (or multichannel pulse train) is determined by the target function optimizer ZFO' for a new candidate HF pulse length $PL_{i+1}$, and the current HF energy parameter value $EP_{i+1}$ is determined for this. Once the loop has been run through for all the candidate HF pulse lengths $PL_1, \ldots PL_N$ (e.g., it is ascertained in the enquiry that i is not smaller than N (branch n)), the multichannel pulse (or pulse train) $MP_i$ that had the lowest HF energy parameter value $EP_i=\min(EP_1, \ldots EP_N)$ is selected as the optimum multichannel pulse (or multichannel pulse train).

Figure 3:
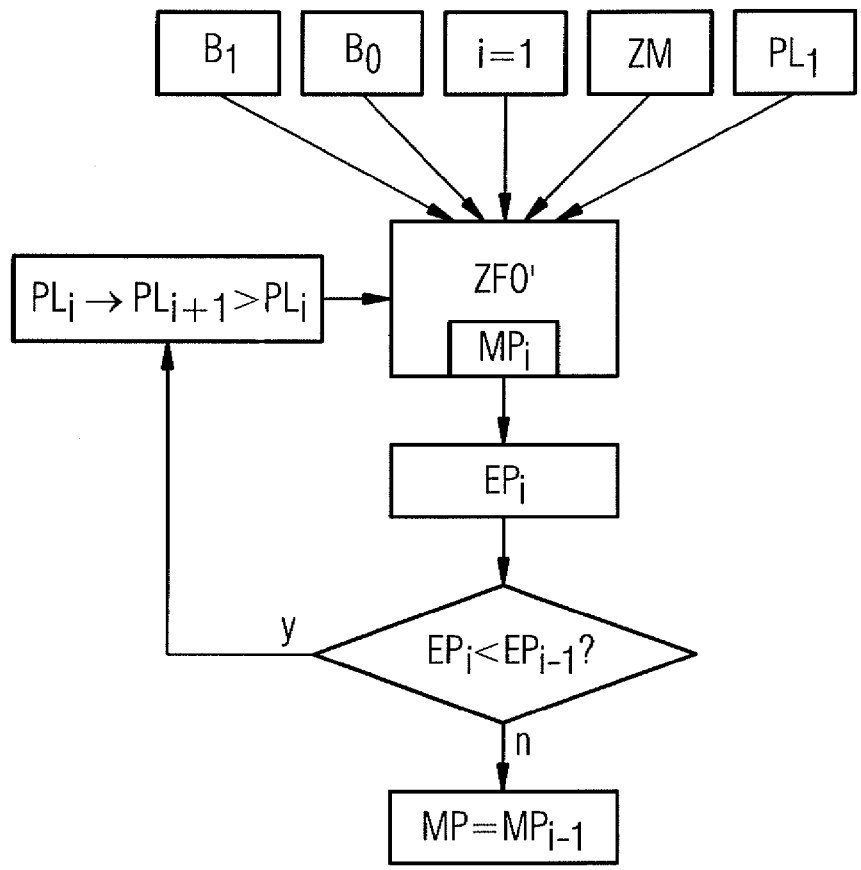
FIG. 3 shows a flow diagram of another embodiment of a method for determining a magnetic resonance system activation sequence.
Figure 4:
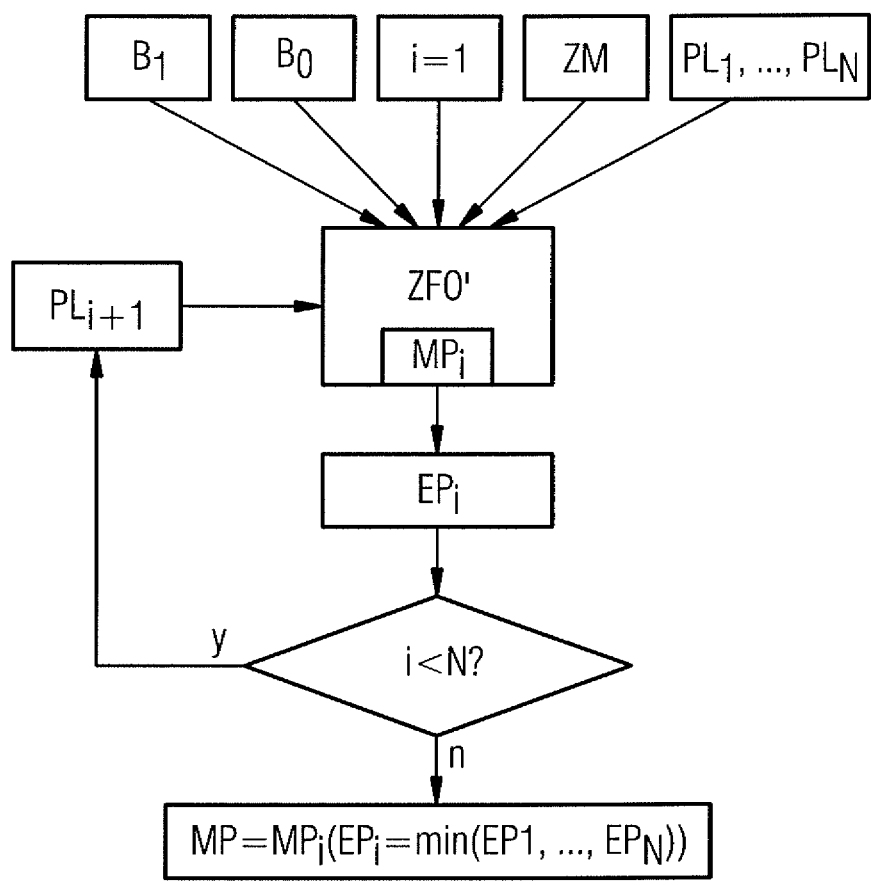
FIG. 4 shows a flow diagram of yet another embodiment of a method for determining a magnetic resonance system activation sequence.

Both with the iterative method according to FIG. 3 and with the simpler method according to FIG. 4, the input HF energy and therefore also the high-frequency exposure of the patient may be significantly reduced with reasonable computation outlay without adversely affecting the desired excitation quality. In other words, HF pulses that have a minimum possible HF energy may be generated. HF pulses of any class may be generated (e.g., TX sense pulses, spokes pulses or composite pulses).

In the case of spoke pulses, only individual points are started up one after the other in the k space by setting x and y gradients (e.g., ten points that are located on a number of circles). To hold a started up x/y position in the k space, the x gradient and y gradient, respectively, are canceled (e.g., no more pulses are applied in the x gradient and y gradient direction). Instead, during the emission of the high-frequency pulses, a z gradient is connected to measure the relevant place in the k space in a slice-selective manner. With such a measurement method, the x and y positions of the "spokes" may be set in the k space by suitable selection of the geometric parameters.

Composite pulses are similar pulses to those in spoke pulse trains. Composite pulses are different, however, in that no gradient pulses are connected in between. A method for using fast pTX pulses to attenuate $B_1$ field inhomogeneities using composite pulses is described, for example, in the article "Fast High-Flip pTx pulse design to mitigate B1+ inhomogeneity using composite pulses at 7 T," by R. Gumbrecht, J. Lee, H-P. Fautz, D. Diehl and E. Adalsteinsson in ISMRM 2010, 101.

Figure 6:
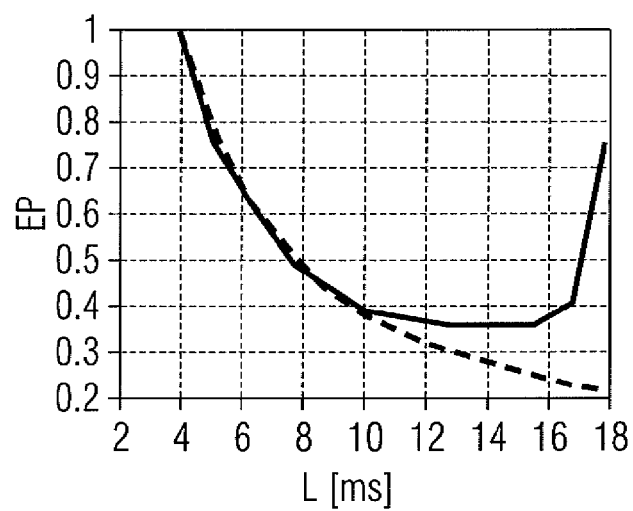
FIG. 6 shows two curves to illustrate a normalized pulse energy as a function of pulse length.

The possibility offered by the method of the present embodiments with respect to saving input pulse energy becomes clear from FIG. 6. FIG. 6 shows the high-frequency energy that represents the energy parameter value EP over the total pulse duration (normalized to 1 as maximum value) in ms for the individual excitation pulses of a composite pulse sequence. The continuous curve shows these values for pulses optimized using the method of the present embodiments so that the target magnetization was achieved as closely as possible, and the $B_0$ inhomogeneities were equalized as far as possible. For comparison, the dotted line shows the effect when only the pulse length is extended independently of the equalization of $B_0$ inhomogeneities (e.g., without taking into account a magnetization tailored as well as possible to the target magnetization) to obtain a low pulse energy. As shown in the diagram, the pulse energies of a pTX composite pulse are highly inversely proportional to the pulse length L up to a pulse length L of 10 ms. This is also the case when pulses are simply lengthened independently of the $B_0$ inhomogeneity and without taking into account the target magnetization. A reduction of the pulse energy EP by a factor of 0.4, for example, is achieved. After this, no further saving of pulse energy EP is achieved. With a further lengthening of the pulses, the pulse energy EP rises again, which shows that a simple lengthening of the pulses is not expedient without the method of the present embodiments.

Figure 7:
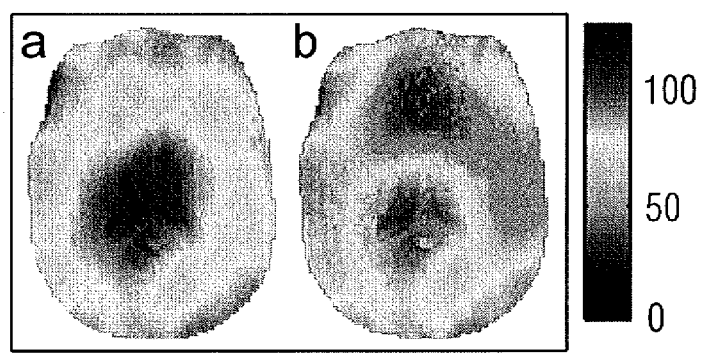
FIG. 7 shows two exemplary simulated flip angle maps for an examination object a) during excitation using one embodiment of a method for determining a magnetic resonance system activation sequence and for comparison, b) during excitation using a conventional HF shim method.

FIG. 7 shows the excitation pattern for the examination object, for which the $B_0$ map according to FIG. 5 is also recorded, for the pulses generated using the method of the present embodiments. The excitation is shown with energy-optimized composite pulses of 9 ms duration according to the method of the present embodiments in the left diagram a. For comparison, diagram b shows the excitation with a pulse of 9 ms duration that has been HF-shimmed in the conventional manner. Significant signal losses occur in certain regions with a conventional pulse, and this is avoided with the method of the present embodiments.

With the method of the present embodiments, better multichannel pulses or complete multichannel pulse trains that are not only more able than conventional methods to equalize $B_0$ field inhomogeneities but are also energy-optimized in the sense that the energy input into the examination object may be reduced, are generated. A reduction of the high-frequency exposure may be used in a further act to accelerate the imaging method.

The detailed methods and structures described above are exemplary embodiments, and the basic principle may also be varied by the person skilled in the art in wide areas without departing from the scope of the invention, as is predefined by the claims. For example, further parameters may also be optimized within the context of the HF exposure optimization method. For example, the parameters used for the HF pulse optimization may be varied in the usual manner within the Tikhonov regularization, or other system parameters may be varied within the context of optimization to achieve even better results. The use of the indefinite article "a" does not exclude the relevant features also being present in a greater number. Likewise, the terms "unit" and "module" do not exclude the possibility of these consisting of a number of components that may optionally also be distributed spatially.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining a magnetic resonance system activation sequence that includes a multichannel pulse having a plurality of individual high frequency (HF) pulses to be emitted in a parallel manner by a magnetic resonance system by way of different independent high-frequency transmit channels, the method comprising:
calculating, with a processor, the multichannel pulse based on input data comprising a predefined magnetic resonance (MR) excitation quality, a predefined current $B_0$ map, and, for each transmit channel, a predefined current $B_1$ map, using an HF pulse optimization method,
wherein an HF pulse length is optimized with respect to an HF energy parameter using the HF pulse optimization method.

2. The method as claimed in claim 1, wherein the input data further comprises a predefined start HF pulse length.

3. The method as claimed in claim 2, wherein a target function optimizer is used within the context of the HF pulse optimization method, the target function optimizer being based on the predefined MR excitation quality and the HF energy parameter, the HF pulse length being used as an additional variable in the target function optimizer.

4. The method as claimed in claim 2, wherein a target function optimizer is used within the context of the HF pulse optimization method, the target function optimizer being run through iteratively a number of times, a current HF pulse length being predefined as a constant for the target function optimizer in each iteration step, wherein calculating the multichannel pulse comprises determining a current multichannel pulse for the current HF pulse length, a current HF energy parameter value being determined for the current multichannel pulse in each instance, and
wherein whether a new iteration step is started or the iteration method is terminated is determined as a function of the current HF energy parameter value.

5. The method as claimed in claim 2, wherein a target function optimizer is used within the context of the HF pulse optimization method, the target function optimizer being run through a number of times, the HF pulse length being selected in each instance from a number of predefined candidate HF pulse lengths for each step of the target function optimizer.

6. The method as claimed in claim 2, wherein the predefined MR excitation quality comprises a target magnetization.

7. The method as claimed in claim 2, wherein the HF energy parameter comprises at least one HF exposure value of an examination object irradiated with at least some HF pulses of the plurality of individual HF pulses by the magnetic resonance system.

8. The method as claimed in claim 1, wherein a target function optimizer is used within the context of the HF pulse optimization method, the target function optimizer being based on the predefined MR excitation quality and the HF energy parameter, the HF pulse length being used as an additional variable in the target function optimizer.

9. The method as claimed in claim 8, wherein the predefined MR excitation quality comprises a target magnetization.

10. The method as claimed in claim 1, wherein a target function optimizer is used within the context of the HF pulse optimization method, the target function optimizer being run through iteratively a number of times, a current HF pulse length being predefined as a constant for the target function optimizer in each iteration step, wherein calculating the multichannel pulse comprises determining a current multichannel pulse for the current HF pulse length, a current HF energy parameter value being determined for the current multichannel pulse in each instance, and
wherein whether a new iteration step is started or the iteration method is terminated is determined as a function of the current HF energy parameter value.

11. The method as claimed in claim 1, wherein a target function optimizer is used within the context of the HF pulse optimization method, the target function optimizer being run through a number of times, the HF pulse length being selected in each instance from a number of predefined candidate HF pulse lengths for each step of the target function optimizer.

12. The method as claimed in claim 1, wherein the predefined MR excitation quality comprises a target magnetization.

13. The method as claimed in claim 1, wherein the HF energy parameter comprises at least one HF exposure value of an examination object irradiated with at least some HF pulses of the plurality of individual HF pulses by the magnetic resonance system.

14. A method for operating a magnetic resonance system having a plurality of independent high-frequency transmit channels, the method comprising:
determining an activation sequence, the activation sequence including a multichannel pulse having a plurality of individual high frequency (HF) pulses to be emitted in a parallel manner by the magnetic resonance system by way of different independent high-frequency transmit channels, the determining comprising:
calculating the multichannel pulse based on input data comprising a predefined magnetic resonance (MR) excitation quality, a predefined current $B_0$ map, and, for each transmit channel, a predefined current $B_1$ map, using an HF pulse optimization method, wherein an HF pulse length is optimized with respect to an HF energy parameter using the HF pulse optimization method; and
operating the magnetic resonance system using the activation sequence.

15. A control sequence determination device for determining a magnetic resonance system activation sequence that includes a multichannel pulse having a plurality of individual high frequency (HF) pulses to be emitted in a parallel manner by a magnetic resonance system by way of different independent HF transmit channels, the control sequence determination device comprising:

an input interface for detecting a predefined magnetic resonance excitation quality;

an HF pulse optimization unit configured to calculate a multichannel pulse based on input data comprising a predefined MR excitation quality, a predefined current $B_0$ map, and, for each transmit channel, a predefined current $B_1$ map, using an HF pulse optimization method; and a control sequence output interface, wherein the control sequence determination device is configured to optimize an HF pulse length with respect to an HF energy parameter using the HF pulse optimization method.

16. A magnetic resonance system having a plurality of independent high-frequency transmit channels, the magnetic resonance system comprising:

a gradient system;

a control device configured to emit a multichannel pulse having a plurality of parallel individual pulses by way of the plurality of independent high-frequency transmit channels to perform a desired measurement based on a predefined activation sequence; and a control sequence determination device operable to determine an activation sequence and transfer the activation sequence to the control facility device, the activation sequence including the multichannel pulse, the control sequence determination device comprising:

an input interface for detecting a predefined magnetic resonance excitation quality;

a pulse optimization unit configured to calculate the multichannel pulse based on input data comprising a predefined MR excitation quality, a predefined current $B_0$ map, and, for each transmit channel, a predefined current $B_1$ map, using a pulse optimization method; and a control sequence output interface, wherein the control sequence determination device is configured to optimize a pulse length with respect to an energy parameter using the HF pulse optimization method.

17. In a non-transitory computer-readable medium that stores a computer program having program code segments executable by a control sequence determination device to determine a magnetic resonance system activation sequence that includes a multichannel pulse having a plurality of individual high frequency (HF) pulses to be emitted in a parallel manner by a magnetic resonance system by way of different independent high-frequency transmit channels, the program code segments comprising:

calculating the multichannel pulse based on input data comprising a predefined magnetic resonance (MR) excitation quality, a predefined current $B_0$ map, and, for each transmit channel, a predefined current $B_1$ map, using an HF pulse optimization method, wherein an HF pulse length is optimized with respect to an HF energy parameter using the HF pulse optimization method.

* * * * *